Jan. 14, 1969 J. N. CASTELLI 3,422,286

LIMITER, PHASE-SHIFTER CIRCUIT

Filed Aug. 26, 1966

Joseph N. Castelli,
INVENTOR.

BY Harry M. Saragovitz
Edward J. Kelly
Herbert Berl
Aubrey J. Dunn

United States Patent Office 3,422,286

Patented Jan. 14, 1969

3,422,286

LIMITER, PHASE-SHIFTER CIRCUIT

Joseph N. Castelli, Plymouth, Mass., assignor, by mesne assignments, to the United States of America as represented by the Secretary of the Army Filed Aug. 26, 1966, Ser. No. 576,185

U.S. Cl. 307—237 3 Claims

Int. Cl. H03k 5/08

ABSTRACT OF THE DISCLOSURE

The invention includes a parallel tuned circuit having a terminal for each end thereof. First and second amplifiers are connected to these terminals and a sine wave of the frequency to which the tuned circuit is tuned is applied to one of the amplifiers. The outputs of the amplifiers, inasmuch as the amplifiers are connected to opposite ends of a tuned circuit, are phase-opposed to each other, or 180° phase-displaced from each other. The arrangement of the amplifiers and the minimum amplitude of the input sine wave is such that relatively large variations in said input amplitude cause small corresponding variations in the amplitudes of the outputs.

This invention relates to a novel electric limiter, phase-splitter circuit for an alternating current input, in particular, a sine wave. The circuit includes amplifiers connected to opposite ends of a parallel tuned circuit, said amplifiers providing outputs 180° phase-displaced from each other.

An object of this invention is to provide an electronic circuit capable of producing two phase-opposed outputs from an alternating current input.

Another object is to provide an electronic circuit capable of producing two amplitude-limited, phase-opposed outputs from an alternating current input.

This invention may be best understood by reference to the drawings, in which.

Figure 1:
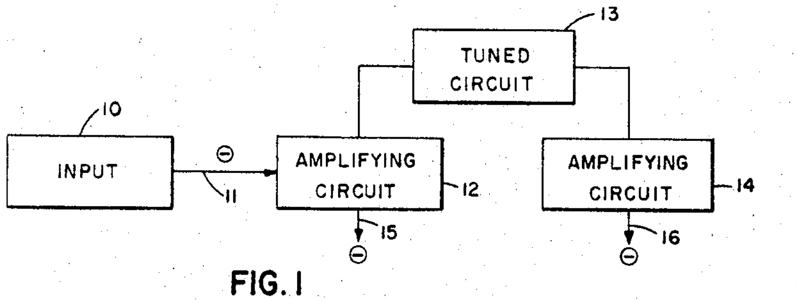
FIGURE 1 is a block diagram of the circuit of the invention.

Referring to FIGURE 1, there is shown an input 10 which provides a sine wave input 11 of phase $\theta$ to a first amplifying circuit 12, which is in turn connected to one end of a tuned circuit 13, and with another amplifying circuit 14 connected to the other end of tuned circuit 13. Amplifying circuit 12 has an output 15 which is of a phase angle of $\theta+180°$ and the output 16 of amplifying circuit 14 is at the angle $\theta$.

Figure 2:
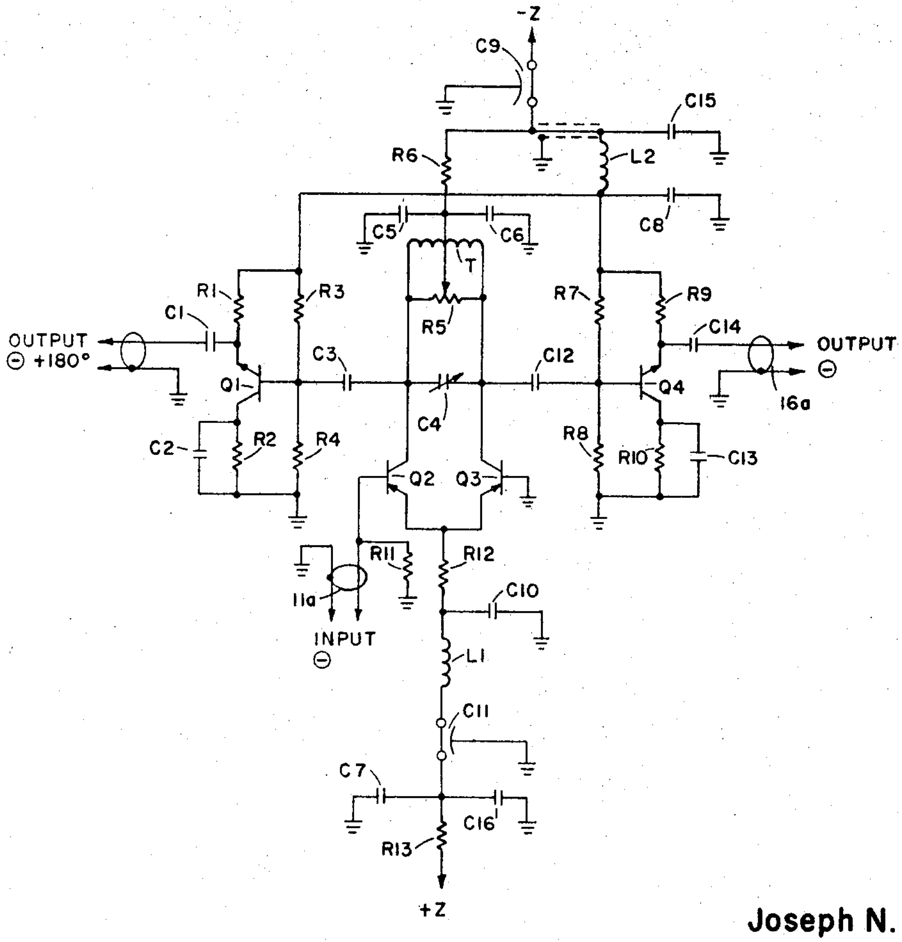
FIGURE 2 shows a specific embodiment of the circuit of the invention.

Referring now to FIGURE 2, transistors Q1 and Q2 and their associated components correspond to the amplifying circuit 12 of FIGURE 1, and transistors Q3 and Q4 and their associated components correspond to the amplifying circuit 14 of FIGURE 1. In the absence of an input signal at input 11*a*, approximately equal current flows through transistors Q2 and Q3, and for a bias voltage (Z) of 12 volts, an approximately 0.25 volt potential exists at the emitters of Q2 and Q3, due to their $V_{be}$ drops. This sets up a current source by the 11.4 drop across resistor R7. As the positive going portion of the first cycle of the input alternating current signal appears on the base of Q2, less current will flow through Q2, and more current will flow through Q3, since the emitters of these transistors are fed, in effect, by a constant current source.

As the negative going portion of the signal appears on the base of Q2, Q2 will conduct harder, causing more current to flow through Q2 and less through Q3.

Since the emitters of Q2 and Q3 are fed from a current source, the alternating current signal on the base of Q2 will cause the current from the source to switch back and forth between Q2 and Q3.

If the input signal exceeds the $V_{be}$ drop of Q2, Q2 will turn off and all of the current will flow through Q3. Further increase of input signal drive beyond this point will produce no additional current through Q3. Hard limiting occurs at this point. The amplitude of the signal from input 10 at 11*a* is such that it is always above this limiting point. Variations in amplitude at the input to Q2, therefore, produces no change in current through Q2 or Q3.

The collectors of Q2 and Q3 are tied to opposite ends of a tuned tank circuit including a winding T, a resistor R5, and a capacitor C4, which tuned circuit is voltage fed at a center tap of T. As the source current is switched from Q2 to Q3, the voltages at the collectors will vary in opposite directions. Due to the fact that the collectors are tied at opposite ends of a tuned circuit, they will be forced to be $\approx 180°$ out of phase with each other.

C4 is the tuned circuit tuning capacitor. Resistor R5 is the tuned circuit shunt resistor which produces the circuit Q and bandwidth desired, and is adjustable to balance the signal amplitudes at the collectors of Q2 and Q3. Transistors Q1 and Q4 are emitter followers which are capable of driving the outputs 15*a* and 16*a*.

Capacitors C2, C6, C8, C10, C11, C13 and C15 are RF bypass capacitors to produce proper RF isolation of the circuit.

L1 and L2 are RF chokes which isolate the alternating current input from the power supply.

R6 is used to lower the collector voltage of Q2 and Q3 to a region where more reliable operation occurs, as well as acting as part of an RF filter for the −Z line.

R11, C15 and C16 form a filter network to prevent +Z transients from effecting transistor current.

C1 and C14 are decoupling capacitors to isolate the emitter DC voltage from the outputs.

Resistors R1, R2, R3, R4, R7, R8, R9 and R10 are bias and load resistors for transistors Q1, Q2, Q3 and Q4.

R12 and R13 are current limiting resistors.

C3 and C12 are coupling capacitors between Q2 and Q1, and Q3 and Q4, respectively.

C5 and C7 are additional filter capacitors.

T is wound on a phenolic core in order to maintain a relatively low coefficient of coupling between its halves. Specific examples of the components used in FIGURE 2 are given below.

| Component | Value | Units |
|---|---|---|
| R1, R9 | 100 | Ohms. |
| R2, R10 | 68 | Do. |
| R3, R7 | 820 | Do. |
| R4, R8 | 910 | Do. |
| R5 | [1] 0–1,000 | Do. |
| R6 | 240 | Do. |
| R11 | 220 | Do. |
| R12 | 560 | Do. |
| R13 | 10 | Do. |
| C1, C14 | .001 | Microfarads. |
| C2, C13 | .01 | Do. |
| C3, C12 | .1 | Do. |
| C4 | [1] 7–45 | Picofarads. |
| C5 | 6.8 | Microfarads. |
| C6, C8, C9, C10, C11, C15 | 1,500 | Picofarads. |
| C7 | 6,800 | Do. |
| C16 | 100 | Microfarads. |

[1] Adjustable.

While specific examples have been listed above for the various components, obviously, other components could be used, depending on the voltage levels used and upon the frequency of the input signal. The particular values above are for a 30 megacycle input.

While the inventive circuit has been shown and described as employing transistors, it should be obvious to one skilled in the art that vacuum tubes could be employed in place of the transistors with the appropriate circuit changes, or semiconductive devices other than transistors could be used.

I claim:

1. A limiter, phase-shifter circuit including a tuned circuit having two terminals; a first electron control device connected to one of the terminals of said tuned circuit; a second electron control device connected to the other terminal of said tuned circuit; and input means connected to said first electron control device, wherein said tuned circuit includes an inductance, a resistance and a capacitance all connected in parallel with one another, and wherein each of said electron control devices is a PNP transistor, with the emitters of said transistors directly connected to each other through a common impedance, with the collectors of said transistors being one each connected to one of each said two terminals of said tuned circuit, and with said input means connected to the base of one of said transistors, with the base of said other transistor being grounded.

2. The circuit of claim 1 wherein said inductance has a center tap thereon, with said center tap connected to a negative voltage source, and with said emitters of said transistors connected to a positive voltage source.

3. The circuit of claim 1 further including a transistor emitter-follower connected to each of said transistors.

References Cited

UNITED STATES PATENTS

| | | | |
|---|---|---|---|
| 2,920,194 | 1/1960 | Geiger | 330—69 X |
| 3,082,377 | 3/1963 | Filipowsky | 328—223 X |
| 3,092,783 | 6/1963 | Krohn | 330—30 |

JOHN S. HEYMAN, *Primary Examiner.*

U.S. Cl. X.R.

307—232, 262; 330—30